(12) United States Patent
Philipp

(10) Patent No.: US 9,081,427 B2
(45) Date of Patent: Jul. 14, 2015

(54) POSITION-SENSING PANEL AND METHOD

(75) Inventor: Harald Philipp, Hamble (GB)

(73) Assignee: Atmel Corporation, San Jose, CA (US)

( * ) Notice: Subject to any disclaimer, the term of this patent is extended or adjusted under 35 U.S.C. 154(b) by 1201 days.

(21) Appl. No.: 12/838,165

(22) Filed: Jul. 16, 2010

(65) Prior Publication Data

US 2012/0013544 A1    Jan. 19, 2012

(51) Int. Cl.
*G06F 3/041* (2006.01)
*G06F 3/044* (2006.01)
*H03K 17/96* (2006.01)
*H05K 3/18* (2006.01)

(52) U.S. Cl.
CPC ............... *G06F 3/041* (2013.01); *G06F 3/044* (2013.01); *H03K 17/962* (2013.01); *G06F 2203/04103* (2013.01); *H05K 3/182* (2013.01); *H05K 3/185* (2013.01); *H05K 2203/0709* (2013.01)

(58) Field of Classification Search
CPC ........ G06F 3/041; G06F 3/044; H03K 17/962
USPC ............................................. 345/173; 341/33
See application file for complete search history.

(56) References Cited

U.S. PATENT DOCUMENTS

| | | | |
|---|---|---|---|
| 5,565,658 A * | 10/1996 | Gerpheide et al. | 345/174 |
| 7,151,528 B2 * | 12/2006 | Taylor et al. | 345/175 |
| 7,663,607 B2 | 2/2010 | Hotelling | |
| 7,808,487 B2 * | 10/2010 | Taylor et al. | 345/168 |
| 7,875,814 B2 | 1/2011 | Chen | |
| 7,920,129 B2 | 4/2011 | Hotelling | |
| 8,031,094 B2 | 10/2011 | Hotelling | |
| 8,031,174 B2 | 10/2011 | Hamblin | |
| 8,040,326 B2 | 10/2011 | Hotelling | |
| 8,049,732 B2 | 11/2011 | Hotelling | |
| 8,179,381 B2 | 5/2012 | Frey | |
| 8,368,656 B2 * | 2/2013 | Wang et al. | 345/173 |
| 2007/0062739 A1 | 3/2007 | Philipp et al. | |
| 2009/0315854 A1 | 12/2009 | Matsuo | |
| 2010/0045632 A1 | 2/2010 | Yilmaz et al. | |
| 2010/0265214 A1 * | 10/2010 | Green et al. | 345/174 |
| 2010/0328240 A1 * | 12/2010 | Matsubara | 345/173 |
| 2011/0007011 A1 * | 1/2011 | Mozdzyn | 345/173 |
| 2011/0050605 A1 * | 3/2011 | Pan et al. | 345/173 |
| 2012/0098779 A1 * | 4/2012 | Nakanishi et al. | 345/173 |

(Continued)

FOREIGN PATENT DOCUMENTS

WO    WO 2012/129247    9/2012

OTHER PUBLICATIONS

U.S. Appl. No. 61/454,936, filed Mar. 21, 2011, Myers.

(Continued)

*Primary Examiner* — Felix O Figueroa
(74) *Attorney, Agent, or Firm* — Baker Botts LLP

(57) ABSTRACT

An exemplary touch position sensing panel includes an opaque electrode layer and a transparent electrode layer separated from the opaque electrode layer by a substrate. The electrodes are arranged such that nodes are formed in areas where the electrodes cross over each other. The transparent electrode layer shields the opaque layer from electric field noise from electric field sources underlying the position-sensing panel, such as a display, while at the same time providing transparency to light emitted from the underlying display. Techniques are also discussed for forming the transparent electrode layer and/or the opaque electrode layer.

20 Claims, 5 Drawing Sheets

(56) References Cited

U.S. PATENT DOCUMENTS

| | | |
|---|---|---|
| 2012/0242588 A1 | 9/2012 | Myers |
| 2012/0242592 A1 | 9/2012 | Rothkopf |
| 2012/0243151 A1 | 9/2012 | Lynch |
| 2012/0243719 A1 | 9/2012 | Franklin |
| 2013/0076612 A1 | 3/2013 | Myers |

OTHER PUBLICATIONS

U.S. Appl. No. 61/454,950, filed Mar. 21, 2011, Lynch.
U.S. Appl. No. 61/454,894, filed Mar. 21, 2011, Rothkopf.
News, New Silver Conductive Inks Target High-Growth Touch Screen and OLED Markets, DuPont Microcircuit Materials Expands Innovative Offerings for Printed Electronics, Research Triangle Park, N.C., Apr. 13, 2010, Printed from website: http://www2dupont.com/MCM/en_US/news_events/article20100413.html on Apr. 20, 2010.
Cambrios Technologies Corporation Awarded Department of Defense Contract for Flexible Solar Cells, Sunnyvale, CA, Apr. 12, 2010, Cambrios Technologies Corp., Printed from website: http://www.cambrios.com/200/DOD_Release.htm on Apr. 20, 2010.
Horteis et al., "Fine Line Printed and Plated Contacts on High Ohmic Emitters Enabling 20% Cell Efficiency," Fraunhofer Institute for Solar Energy Systems, IEEE (2009).
Core Applications & Technologies, Printing of Antennas and Flexible Circuits, Conductive InkJet Technology Ltd. (2009).
Latest News, Conductive InkJet Technology, Printed from Website: http://www.conductiveinkjet.com/about-us/latest-news/2009.aspx on Apr. 20, 2010.

* cited by examiner

POSITION-SENSING PANEL AND METHOD

BACKGROUND

A position sensor is a device that can detect the presence and location of a touch (contact or proximity), by a finger or by an object, such as a stylus, for example, within an area of an external interface of the position sensor. In a touch sensitive display application, the position sensor enables direct interaction with what is displayed on the screen, rather than indirectly with a mouse or touchpad. Position sensors can be attached to or provided as part of devices with a display, including but not limited to computers, personal digital assistants (PDAs), satellite navigation devices, mobile telephones, portable media players, portable game consoles, public information kiosks, and point of sale systems. Position sensors have also been used as control panels on various appliances.

There are a number of different types of position sensors/touch screens, such as resistive touch screens, surface acoustic wave touch screens, capacitive touch screens etc. A capacitive touch screen, for example, may include an insulator, coated with a transparent conductor in a particular pattern. When an object, such as a finger or a stylus, touches or is provided in close proximity to the surface of the screen there is a change in capacitance. This change in capacitance is sent to a controller for processing to determine the position of the touch.

Current touch screen electrode layers are generally made of solid shapes of etched transparent conductive material, such as ITO (indium-tin-oxide), on two layers, forming X and Y electrodes, which define resolution of touch in their respective axis. These layers typically are formed on separate substrates which are then laminated together with a pressure sensitive clear adhesive. This construction method undesirably adds to the overall thickness of the panel while increasing fabrication cost and lowering production yields and reliability.

The electrodes on the layer closest to the display can in some configurations be driven with a low impedance signal which serves to shield the receiving outer receiving electrodes from electrical noise generated by the display itself. However the transparent conductive material has a sheet resistance which is often sufficiently high so as to allow 'punch through' of the noise signal from the display, albeit attenuated, to reach the receive electrodes. This punch through of the signal from the display reduces the signal to noise ratio of the touch screen, thereby degrading performance.

The outer, receive electrodes are typically designed to have large surface areas, to reduce losses due to resistance and to facilitate signal pickup from a finger or stylus. However, the use of large surface areas for the receive electrode causes increased common mode noise coupling from a finger when the screen is touched, and it is therefore desirous to minimize this surface area as much as possible. Furthermore, transparent conductive electrodes such as ITO can be expensive, difficult to process and prone to micro-fracturing during processing and application to a panel, and require additional metal traces to them to make electrical connections, which involves additional process steps.

SUMMARY

An exemplary touch position sensing panel includes a finely structured metal receive electrode layer and transparent conductive material drive electrode layer separated and isolated from the metal electrode layer by a substrate. The electrodes are arranged such that nodes are formed in areas where the electrodes from each layer cross over each other. The transparent conductive material layer, being composed of substantially solid electrode shapes and driven by a low impedance voltage source, shields the metal layer from electric field noise from electric field sources underlying the position-sensing panel, such as an active display, while at the same time providing transparency to light emitted from the underlying display. Techniques are also discussed for forming the transparent conductive material and metal electrode layers.

BRIEF DESCRIPTION OF THE FIGURES

The figures depict one or more implementations in accordance with the present teachings, by way of example only, not by way of limitation. In the figures, like reference numerals refer to the same or similar elements.

DETAILED DESCRIPTION

Reference now is made in detail to the examples illustrated in the accompanying figures and discussed below.

A display may be overlaid with a position-sensing panel. The display may include various forms. Examples include, but are not limited to a liquid crystal (for example, active matrix liquid crystal), electroluminescent, electrophoretic, plasma, cathode-ray display, OLED, or the like. It will be appreciated that light emitted from the display must be able to pass through the position sensing panel with minimal absorption or obstruction in order to be clearly visible.

Figure 1:
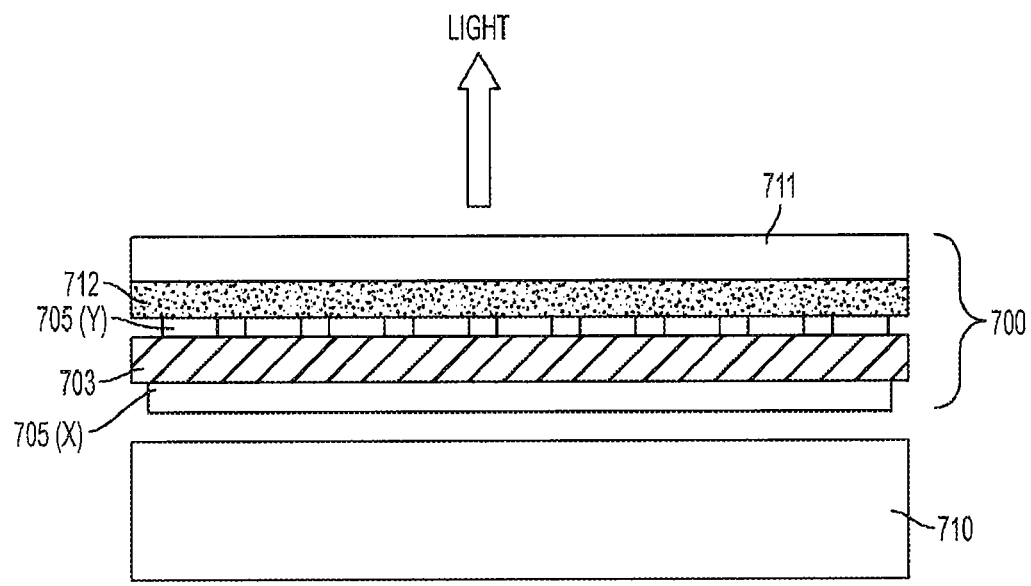
FIG. 1 illustrates schematically a cross-section of an exemplary position sensing panel.

FIG. 1 illustrates an exemplary touch position-sensing panel 700 which overlies a display 710. In the panel 700, a substrate 703 has a first 705 (X) and second 705 (Y) electrodes provided on opposite sides of the substrate 703. The substrate 703 has a surface on each side. The electrodes 705 (X) and 705 (Y) may be formed on opposing surfaces of the substrate 703. The substrate 703 is also provided adjacent to the display 710 such that one electrode 705 (X) is between the display 710 and the substrate 703. An air gap is formed between the display 710 and the first electrode 705 (X) and an adhesive layer 712 is between the second electrode 705(Y) and the transparent covering sheet 711.

In other embodiments, the touch position-sensing panel may have a second substrate (not shown). For example, such a touch position-sensing panel has a transparent panel, a first adhesive layer on the panel, a first electrode layer comprising first electrodes, a first substrate, a second adhesive layer, a second electrode layer comprising second electrodes, and a second substrate. In such an example, the first conductive electrode layer is attached to the first substrate and the second electrode is attached to the second substrate.

Display 710 may be selected from any of the aforementioned displays. Substrate 703, which forms a core of the position-sensing panel 700 is formed from a transparent, non-conductive material such as glass or a plastic. Examples of suitable plastic substrate materials include, but are not limited to Polyethylene terephthalate (PET), Polyethylene Naphthalate (PEN), or polycarbonate (PC). However, the panel structure and production methodology may be utilized in other types of touch position sensing panels. Hence, in the example, drive (X) electrodes 705(X) are provided on one surface of the substrate 703, and sensing (Y) electrodes 705(Y) are provided on the opposing surface of the substrate 703. Capacitive sensing channels are formed at the capacitive coupling nodes which exist in the localized regions surrounding where the first and second electrodes 705(X) and 705(Y) cross over each other (separated by the non-conductive substrate 703).

Transparent covering sheet 711 is provided over the substrate 703, and may be joined thereto by any means. One exemplary means is a pressure-sensitive adhesive. In one example, the covering sheet 711 may be glass, polycarbonate, or PMMA.

ITO is discussed here by way of an example of a clear conductive material for a set of the electrodes, e.g. for the drive electrodes 705(X) in FIG. 1. However, any clear conductive material may be used, such as other inorganic and organic conductive materials, such as ATO (Antimony tin oxide), tin oxide, PEDOT or other conductive polymers, carbon nanotube or metal nanowire impregnated materials, and the like.

Figure 2:
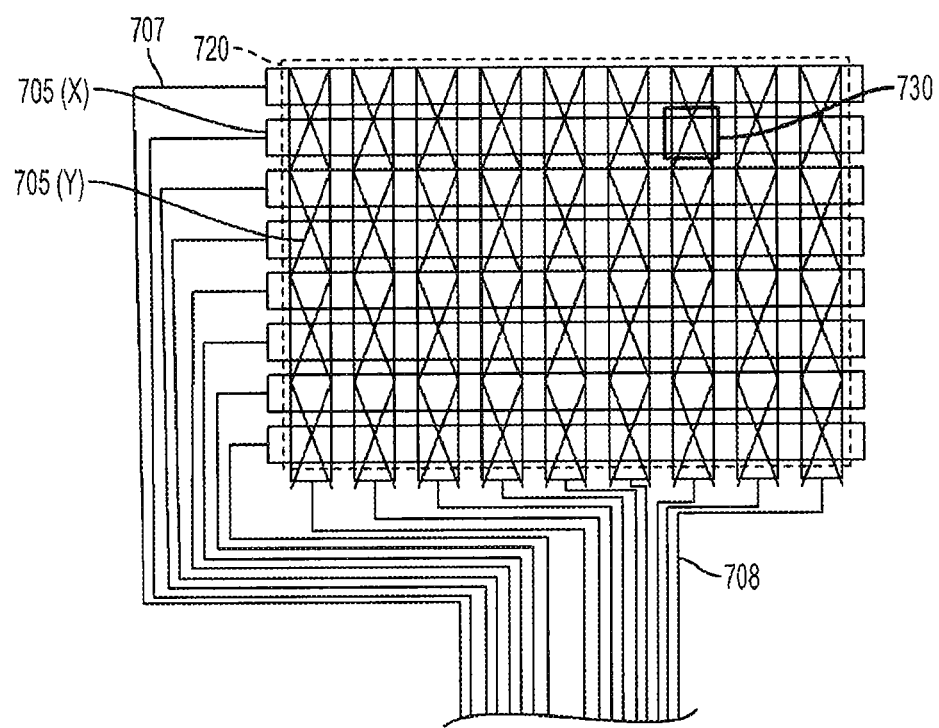
FIG. 2 illustrates schematically the arrangement of driving and sensing electrodes of an exemplary position sensing panel.

With reference to FIG. 2, the drive electrodes 705(X) have solid areas of ITO (in this example, ITO stripes, shown as outlines), and the sensing electrodes 705(Y) are formed in fine line patterns, described in more detail below. Sensing area 720 of the position sensing panel, denoted by the dotted line in FIG. 2, encompasses each or substantially each of the intersections 730 formed by the X and Y electrodes. Moreover, the gaps between adjacent X electrode bars are made as narrow as possible to enhance their shielding ability against noise arising from the underlying display. In some examples, at least 90% of the sensing area 720 is covered by ITO, and the gap between adjacent ITO X electrodes is preferably no more than 200 microns. Substantially the whole of the area of each intersection 730 is shielded by the solid drive electrode bars.

In one example, the ITO bars form drive electrodes in which each bar forms a plurality of channels with sensing electrodes on an adjacent plane. However, it will be appreciated that other arrangements are possible, and in particular the shape of the drive electrodes and the interconnection between the channels of any given electrode may be modified, for example according to the type of touch with which the position sensing panel is intended to be used. For example, the stripes may have saw-tooth or diamond shape edges (and therefore attendant inter-stripe gaps) to facilitate field interpolation to aid in smoothing positional response (not shown). In some examples, the drive electrodes have a width of from about 3 mm to about 12 mm depending on design.

The sensing electrodes 705(Y) are formed from a conductive material, such as a metal. Suitable metals include copper, silver, gold, aluminum, and tin and other metals suitable for use in conductive wiring. The sensing electrodes are patterned in fine lines to allow most of the light emitted from the display and incident on the sensing electrode layer to pass through the sensing electrode layer. The fine lines are optionally no more than 20 microns wide. For example, the fine lines can be 10 microns wide. In another example, the fine lines can be 5 microns wide. An exemplary range is 3-10 microns. Narrower lines reduce their visibility to the naked eye and are thus preferred. By forming sensing electrodes 705(Y) from fine conductive lines, the position sensing panel may be formed such that no more than 10%, or no more than 5%, or no more than 3% of the active area is covered by Y electrodes, thus allowing for good transparency of the position sensing panel. Moreover, at these thicknesses the fine line pattern is invisible or virtually invisible to the naked eye and as such will not result in any perceptible darkening or other loss of display quality.

FIG. 2 illustrates sensing electrodes 705(Y) formed as outlines of stripes in a crisscross pattern although it will be appreciated that any pattern may be used that allows most light incident on the sensing electrode layer to pass through gaps in the layer. The number of rows and columns shown is by way of illustration only, and the number shown is not limiting.

Drive electrode connecting lines 707 are shown leading out from the drive electrodes 705(X) for connection to a control unit (not shown). Sensing electrode connecting lines 708 likewise are provided to connect sensing electrodes 705(Y) to the same or a different control unit. The patterns of the connecting lines are shown by way of an example only.

Figure 3:
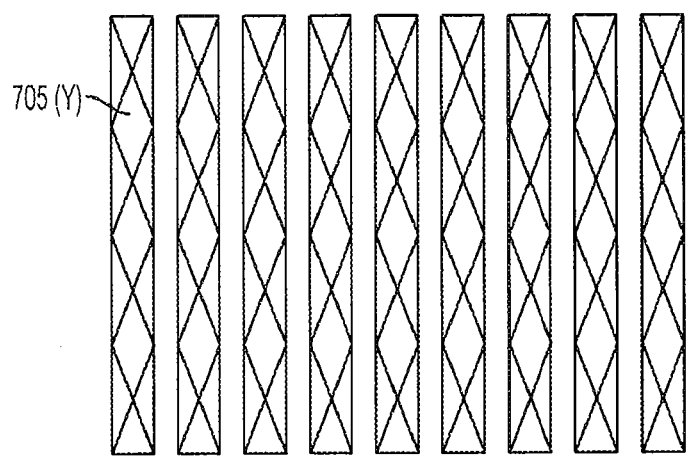
FIG. 3 illustrates schematically the sensing electrodes of FIG. 2.

FIG. 3 illustrates the sensing electrode layer of FIG. 2 with the sensing electrodes 705(Y) shown in isolation from the rest of the position sensing panel. As shown, each sensing electrode 705(Y) comprises a pattern, such as a rectangular perimeter line and crisscross pattern. The fine line pattern allows most light incident on this electrode layer to pass through the gaps in the layer with minimal obstruction. In other examples, the lines making up electrodes 705(Y) can be arranged in an anti-moire pattern to suppress optical interference effects with the underlying display, for example by using odd angles for the lines, breaking up straight lines into zigzag patterns, using curved lines, using randomized line segment angles and placements, and the like.

Figure 4:
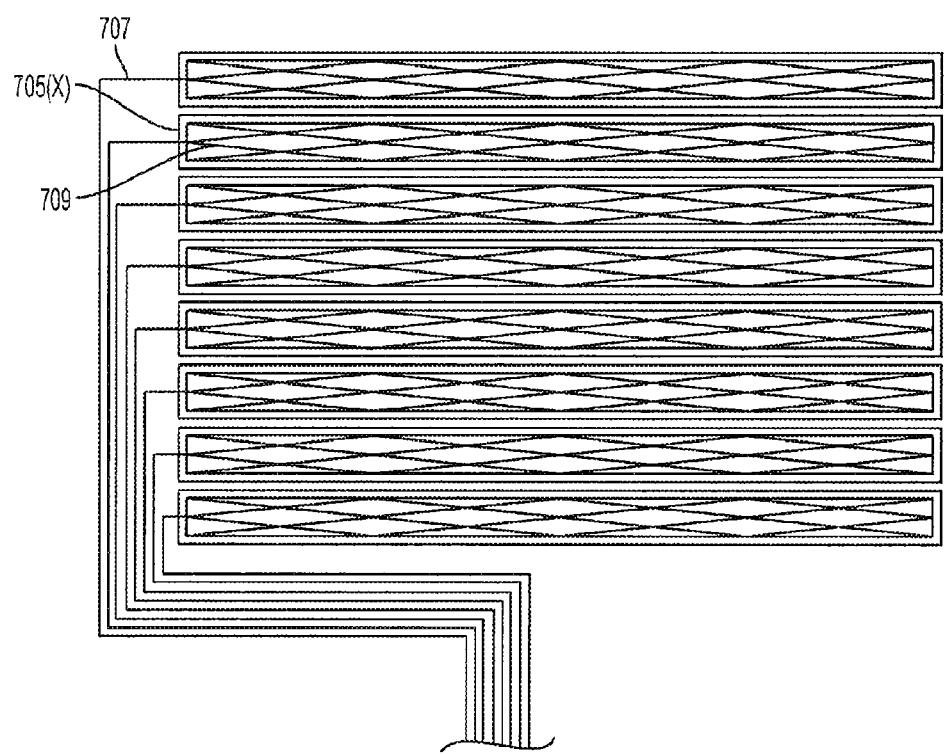
FIG. 4 illustrates schematically the drive electrodes for use in an exemplary position-sensing panel.

FIG. 4 is a further example illustrating another arrangement of the drive electrodes. Sense electrodes may be formed as in the previous examples, although they are omitted here for ease of illustration of the drive electrodes. As with the example illustrated in FIG. 2, the drive electrodes 705(X) have solid areas of ITO that together cover substantially the whole of the active area of the position sensing panel, except in regions between the drive electrodes. Additionally, a fine line pattern of conductive material, optionally fine line metal, is provided in each block area in direct contact with electrode ITO. This fine line pattern forms an auxiliary conductor 709 that may serve to increase the conductivity of the drive electrode 705(X) associated with the auxiliary conductor 709. This may be used for large area position sensing panels with long electrodes in view of the relatively low conductivity of ITO when compared to metals such as copper, or other metals suitable for use in fine line patterning as described above, as electrical noise fields from the underlying display are better attenuated with increasing electrode conductivity. As with the fine line patterns forming the sensing electrodes 705(Y), the auxiliary conductor 709 allows most light incident on it to pass through. As such, the thickness of the fine line pattern forming the auxiliary conductor 709 optionally has a line thickness and active area coverage selected from the same range as the fine line patterns forming the sensing electrodes 705(Y).

In this example, the auxiliary conductor 709 is patterned in a crisscross pattern similar to the pattern used to form the sensing electrodes 705(Y); however, it will be appreciated that other patterns, including but not limited to one or more straight lines running across each electrode 705(X), may be provided. In other examples, the auxiliary conductors 709 of the driving electrodes can be arranged in an anti-moire pattern as discussed supra in conjunction with the 705(Y) electrodes.

Connecting lines 707 that connect the drive electrodes 705(X) to a control unit may be formed as part of the process of forming the auxiliary conductors 709, as described in more detail below.

Figure 5:
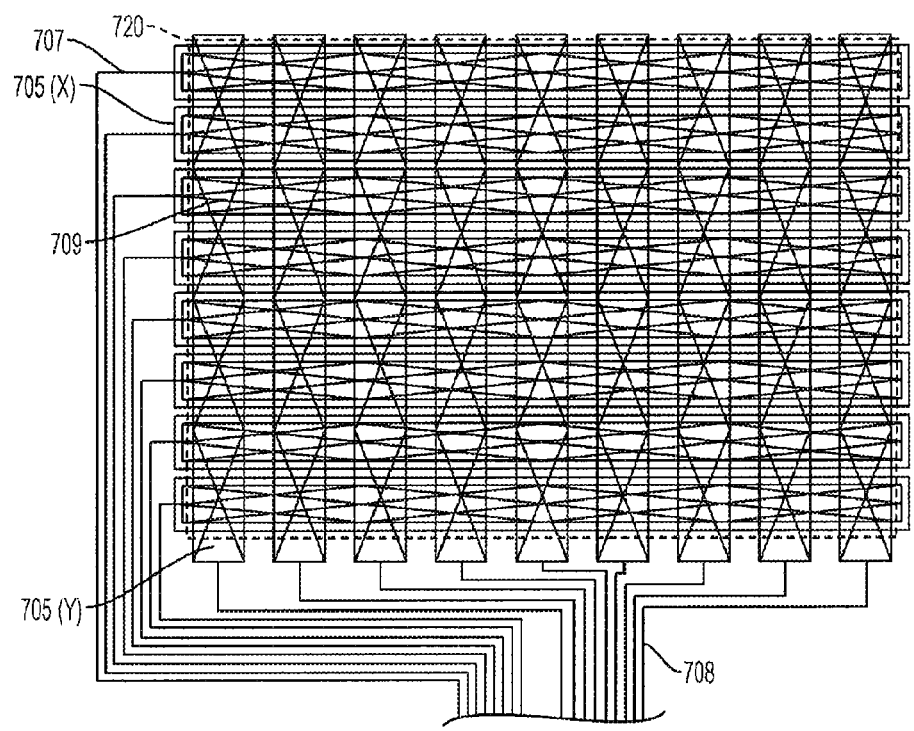
FIG. 5 illustrates an arrangement of drive electrodes of FIG. 4 and sensing electrodes of an exemplary position sensing panel.

FIG. 5 illustrates an arrangement of driving electrodes 705(X) having auxiliary conductors 709 as illustrated in FIG. 4 and sensing electrodes 705(Y) as illustrated in FIG. 3. The fine line patterns of the auxiliary conductors 709 and the sensing electrodes 705(Y) are such that most light emitted from an underlying display may still pass through the position-sensing panel.

The transparency of the position sensing panel optionally transmits at least 95% of light having a wavelength in the visible part of the electromagnetic spectrum that is incident on the panel, in particular from a display underlying the panel.

The process of manufacturing the position-sensing panel illustrated in FIGS. 1-4 includes the steps of patterning drive electrodes, such as ITO drive electrodes, on one substrate surface and patterning fine line sensing electrodes on the opposite surface of the same substrate layer and, in the case of the example illustrated in FIGS. 4 and 5, forming a fine-line metal pattern associated with the drive electrodes. In the case where the drive electrodes 705(X) are formed from ITO, the process of patterning the electrodes may include the following steps of depositing a positive or negative resist over unpatterned ITO on a substrate; exposing the photoresist to UV light through a mask of the appropriate pattern; developing the resist by washing away unexposed resist with a solvent, and then etching away the exposed ITO areas using a suitable etchant; and finally removing the exposed photoresist using a suitable solvent.

One suitable etching liquid for use in removing exposed ITO is, for example an etching acid. An example of a suitable removal liquid for the photoresist includes organic solvents. Other suitable positive and negative photoresists, etching liquids and photoresist removal liquids may also be used.

Alternatively, ITO may for example be deposited on the substrate by sputtering ITO onto the substrate using a shadow mask having a pattern suitable for formation of electrodes in the required shape as described above.

The process of patterning the fine line Y electrodes may include deposition of the conductive material, for example metal, by evaporation through a mask in the appropriate pattern.

Alternatively, the fine-line metal may be formed by a printing process in which a conductive material or conductive material precursor is printed (for example, by inkjet printing) to form the Y electrode pattern and, in the case where a catalytic precursor ink is used, treating the precursor ink to convert it to the final conductive material, for example by electroless plating. Alternatively the substrate may be uniformly coated with a catalytic photosensitive ink which is exposed to UV light through a photomask or vector-exposed to UV light from a laser or other suitable light source, rinsed with solvent to wash away the unexposed ink, then immersing the remaining ink in a metal plating bath to form the fine conductive traces. Suitable catalytic inks are commercially available, for example, from Conductive Inkjet Technology Ltd, UK.

Lead-outs 707, 708 for connection of the sensing electrodes to a control unit of the position-sensing panel may be formed in the same process step as formation of the sensing electrodes.

Auxiliary conductors, where present (for example as in FIGS. 4 and 5), may be formed in the same way as the sensing electrodes. In one example, the same method (e.g. evaporation or printing) is used to form both the sensing electrodes and auxiliary conductors in order to simplify manufacture of the position sensing panel. In another example, the fine metal conductor lines are formed first using one of the methods described supra in conjunction with the sensing lines, followed by sputtering ITO on top of the metal lines through a mask, or by printing a clear conductive organic polymer such as PEDOT on top of the lines using a suitable printing process.

The auxiliary conductors may be formed with lead-outs for connection of the drive electrodes to a control unit of the position-sensing panel. In the arrangement shown in FIG. 4, the auxiliary conductors are deposited before deposition of ITO, however the auxiliary conductors may alternatively be deposited after deposition of ITO, for example by any of a number of printing processes.

Although some exemplary processes are given above for forming drive electrodes, sensing electrodes and auxiliary conductors, it will be appreciated that any suitable way of forming these electrodes and conductors can be used in conjunction with the disclosure provided herein.

The touch position sensors described above can be attached to numerous electronic devices, such as computers, personal digital assistants (PDA), satellite navigation devices, mobile phones, portable media players, portable game consoles, public information kiosks, point of sale systems etc. All of these electronic devices typically include a central processor or other processing device for executing program instructions, an internal communication bus, various types of memory or storage media (RAM, ROM, EEPROM, cache memory, disk drives etc.) for code and data storage, and one or more network interface cards or ports for communication purposes.

The exemplary technologies discussed in the detailed description above may provide a touch position sensing panel with one or more properties of: thinness, shielding of the panel by the drive electrodes from electric field noise, high transparency and low manufacturing cost.

Various modifications may be made to the examples described in the foregoing, and any related teachings may be applied in numerous applications, only some of which have been described herein. It is intended by the following claims to claim any and all applications, modifications and variations that fall within the true scope of the present teachings.

While the above discussion is pertinent to mutual capacitance drive approaches, self-capacitance drive methods also have similar problems and therefore may be similarly improved by application of the technologies discussed in the examples above.

The invention claimed is:

1. A touch position-sensing panel comprising:
a sensing area;
a substrate;
a plurality of first electrodes formed of a transparent conductive material, provided on a first side of the substrate; and
a plurality of second electrodes formed of an opaque material, provided on a second side of the substrate, opposite the first side, wherein:
the plurality of first electrodes are arranged in a first direction,
the plurality of second electrodes are arranged in a second direction different from the first direction such that the first and second electrodes cross over each other to form touch sensing nodes in the sensing area,
the transparent conductive material of the first electrodes extends across substantially an entirety of the sensing area, and the second electrodes formed of the opaque conductive material are sized and patterned to provide gaps between the second electrodes to allow visible transmission of light through the panel.

2. The touch position-sensing panel of claim 1, wherein said first electrodes cover 90% or more of the node area.

3. The touch position-sensing panel of claim 1, wherein said plurality of first electrodes are comprised of indium tin oxide.

4. The touch position-sensing panel of claim 1, wherein the plurality of second electrodes are comprised of metal.

5. The touch position-sensing panel of claim 4, wherein the plurality of second electrodes comprise at least one metal, the at least one metal comprising one or more of copper, silver, gold, aluminum, and tin.

6. The touch position-sensing panel of claim 1, wherein at least one of the first electrodes arranged on the first side comprises:
   a first electrode portion formed of the transparent conductive material and extending across substantially an entirety of the sensing area, the first electrode portion having an area; and
   a second electrode portion formed of an opaque material, the second electrode portion formed on the first electrode portion within the area of the first electrode portion.

7. The touch position-sensing panel of claim 6, wherein the second electrode portion comprises metal.

8. The touch position-sensing panel of claim 6, wherein the second electrode portion comprises at least one metal, the at least one metal comprising one or more of copper, silver, gold, aluminum, and tin.

9. The touch position-sensing panel of claim 6, wherein the second electrode portion is arranged in anti-moire pattern.

10. The touch position-sensing panel of claim 1, wherein the first electrodes are configured to shield the second electrodes from electrical noise.

11. The touch position-sensing panel of claim 1, wherein the plurality of second electrodes are arranged in anti-moire pattern.

12. The position-sensing panel of claim 1, wherein a gap between the plurality of first electrodes is 200 microns or less.

13. The touch position-sensing panel of claim 1, wherein the first electrode is on a first surface of the substrate and the second electrode is on a second surface of the substrate opposite the first surface.

14. The touch position-sensing panel of claim 1, wherein:
   the first plurality of electrodes comprise drive electrodes; and
   the second plurality of electrodes comprise sense electrodes.

15. The touch position-sensing panel of claim 1, wherein the second electrodes formed of the opaque conductive material comprise fine lines of metal and are sized and patterned to provide gaps within the second electrodes to allow visible transmission of light through the panel.

16. A touch sensitive display device comprising:
   a node area;
   a substrate;
   a plurality of first electrodes formed of a transparent conductive material provided on a first side of the substrate;
   a plurality of second electrodes formed of an opaque conductive material; and
   a display panel arranged adjacent to the first electrodes;
   wherein:
      the plurality of first electrodes are arranged in a first direction,
      the plurality of second electrodes are arranged in a second direction different from the first direction such that the first and second electrodes cross over each other to form touch sensing nodes in the node area,
      the transparent conductive material extends across substantially an entirety of the node area,
      the second conductive electrodes formed of the opaque conductive material are sized and patterned to provide gaps between the second electrodes to allow visible transmission of light from the display through the panel, and
      the plurality of first electrodes are arranged between the substrate and the display panel.

17. The touch sensitive display device of claim 16, wherein the first electrodes are configured to shield the second electrodes from at least some noise from the display panel.

18. The touch sensitive display device of claim 16, wherein the first electrode is on a first surface and the second electrode is on a second surface of the substrate opposite the first surface.

19. The touch sensitive display device of claim 16, wherein:
   the first plurality of electrodes comprise drive electrodes; and
   the second plurality of electrodes comprise sense electrodes.

20. The touch sensitive display device of claim 16, wherein the second electrodes formed of the opaque conductive material comprise fine lines of metal and are sized and patterned to provide gaps within the second electrodes to allow visible transmission of light through the panel.

* * * * *